(12) United States Patent
Mouttet (10) Patent No.: US 7,755,424 B2
(45) Date of Patent: Jul. 13, 2010

(54) OPERATIONAL AMPLIFIER WITH RESISTANCE SWITCH CROSSBAR FEEDBACK

(76) Inventor: Blaise Laurent Mouttet, 4201 Wilson Blvd. #110-364, Arlington, VA (US) 22203

( * ) Notice: Subject to any disclaimer, the term of this patent is extended or adjusted under 35 U.S.C. 154(b) by 89 days.

(21) Appl. No.: 12/222,692

(22) Filed: Aug. 14, 2008

(65) Prior Publication Data

US 2008/0307151 A1 Dec. 11, 2008

Related U.S. Application Data (63) Continuation-in-part of application No. 11/976,927, filed on Oct. 30, 2007, now Pat. No. 7,609,086, which is a continuation-in-part of application No. 11/798,647, filed on May 16, 2007, which is a continuation-in-part of application No. 11/395,237, filed on Apr. 3, 2006, now Pat. No. 7,302,513.

(51) Int. Cl.
*H03F 1/36* (2006.01)
(52) U.S. Cl. .......................................... 330/86; 330/144
(58) Field of Classification Search ................... 330/86, 330/144, 282, 284
See application file for complete search history.

(56) References Cited

U.S. PATENT DOCUMENTS

| | | | |
|---|---|---|---|
| 4,597,162 A | 7/1986 | Johnson et al. | |
| 5,272,359 A | 12/1993 | Nagasubramanian et al. | |
| 5,625,361 A | 4/1997 | Garrity et al. | |
| 5,680,070 A | 10/1997 | Anderson et al. | |
| 5,691,664 A | 11/1997 | Anderson et al. | |
| 6,128,214 A | 10/2000 | Kuekes et al. | |
| 6,198,655 B1 | 3/2001 | Heath et al. | |
| 6,531,371 B2 | 3/2003 | Hsu et al. | |
| 7,183,141 B1 | 2/2007 | Bulovic et al. | |
| 2007/0200158 A1 | 8/2007 | Genrikh et al. | |
| 2008/0090337 A1 | 4/2008 | Williams | |
| 2008/0152792 A1* | 6/2008 | Lian et al. | 427/126.1 |
| 2009/0108912 A1* | 4/2009 | Erstad | 327/509 |

OTHER PUBLICATIONS

Hall et al., Large-Scale Field-Programmable Analog Arrays for Analog Signal Processing, Nov. 2005, 2298-2307, vol. 52, No. 11.
Strukov et al., The Missing Memristor Found, May 1, 2008, 80-83, vol. 453.

* cited by examiner

*Primary Examiner*—Steven J Mottola (57) ABSTRACT

A control circuit includes an operational amplifier having an inverting input, a non-inverting input, and an output, an array of impedance elements including capacitors are connected to the output of the operational amplifier, and a resistance switch crossbar array configured to store data in the form of high or low resistance states, wherein the resistance switch crossbar array is electrically connected between the array of impedance elements and the inverting input of the operational amplifier. The crossbar control circuit may be implemented in a control system to provide for adjustment of the control system to changes in environmental conditions or to change the function of the control system.

19 Claims, 9 Drawing Sheets

OPERATIONAL AMPLIFIER WITH RESISTANCE SWITCH CROSSBAR FEEDBACK

This patent application is a Continuation-In-Part of U.S. patent application Ser. No. 11/976,927, filed Oct. 30, 2007, now U.S. Pat. No. 7,609,086 which is a Continuation-In-Part of U.S. patent application Ser. No. 11/798,647, filed May 16, 2007, which is a Continuation-In-Part of U.S. patent application Ser. No. 11/395,237, filed Apr. 3, 2006, issued as U.S. Pat. No. 7,302,513.

FIELD OF THE INVENTION

The present invention pertains to a control circuit using a crossbar switching architecture suitable for applications in signal processing, morphware, and robotics.

BACKGROUND AND BRIEF DESCRIPTION OF THE INVENTION

As disclosed in parent U.S. patent application Ser. Nos. 11/976,927, 11/798,647, and 11/395,237, which are each incorporated by reference in their entirety, crossbar circuit architectures may be configured to provide for programmable signal processors. The present patent application provides further embodiments of such systems to provide adaptive control system applications.

Figure 1:
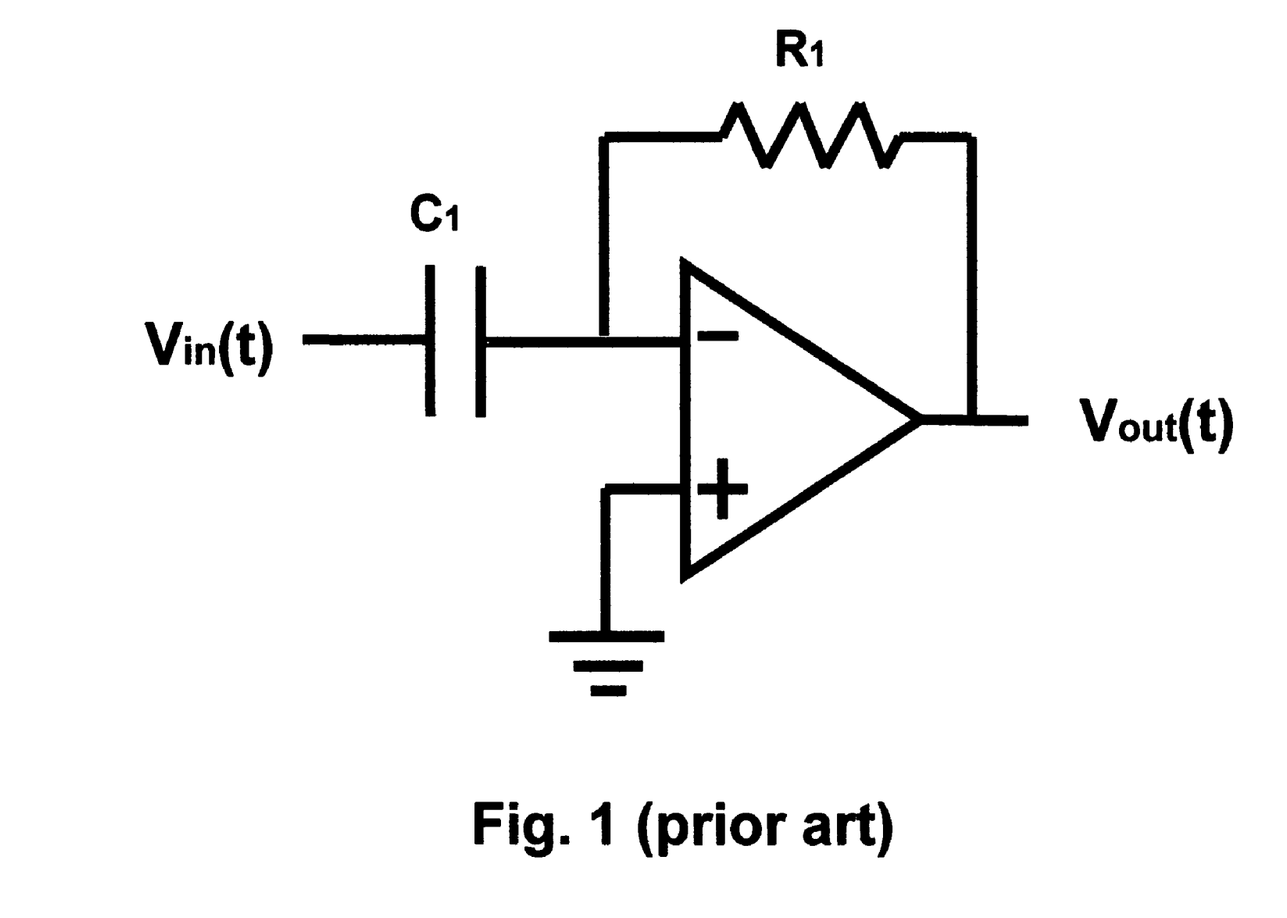
FIG. 1 illustrates a prior art example of an operational amplifier circuit configured as a high pass filter or differentiator.
Figure 2:
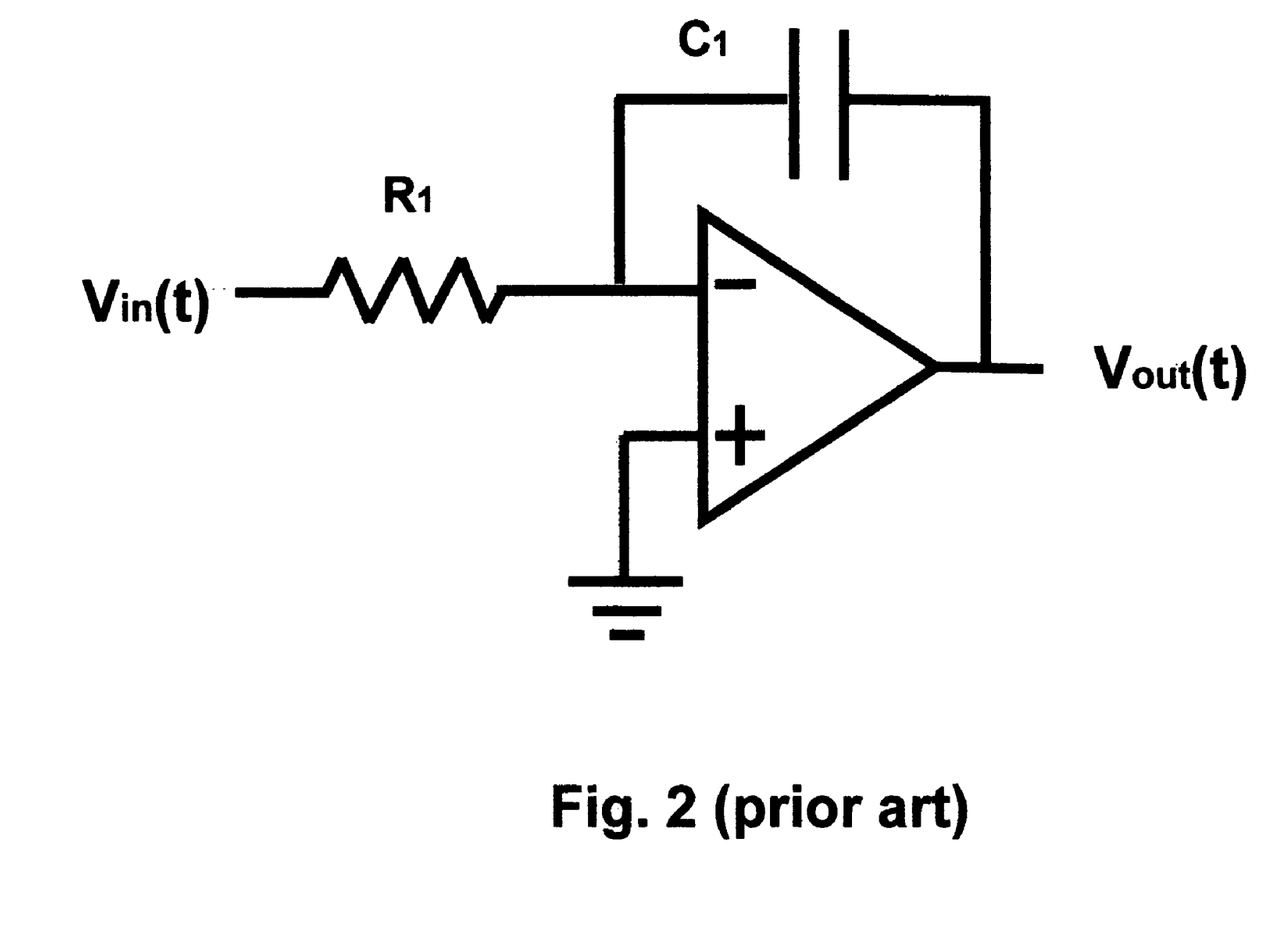
FIG. 2 illustrates a prior art example of an operational amplifier circuit configured as a low pass filter or integrator.

Operational amplifiers are often found in analog processing systems and can be used to construct a variety of devices such as high pass filter/differentiator circuits as illustrated in FIG. 1 or low pass filter/integrator circuits as illustrated in FIG. 2. However, environmental effects such as changes in temperature or humidity may alter circuit parameters used in analog processing leading to improper operation. In other cases, it may be desirable to switch one type of analog processing circuit to another type of analog processing circuit to achieve greater functionality with a lower number of total parts. Resistance switch crossbar arrays have been under investigation for the past several years for applications in non-volatile memory such as RRAM and in programmable logic. The present invention is directed to applying such resistance switch crossbar technology to a reconfigurable filter or control circuit in order to provide adaptable analog processing circuits which can more easily adjust to variation in environmental conditions or different desired uses.

DETAILED DESCRIPTION

Figure 3:
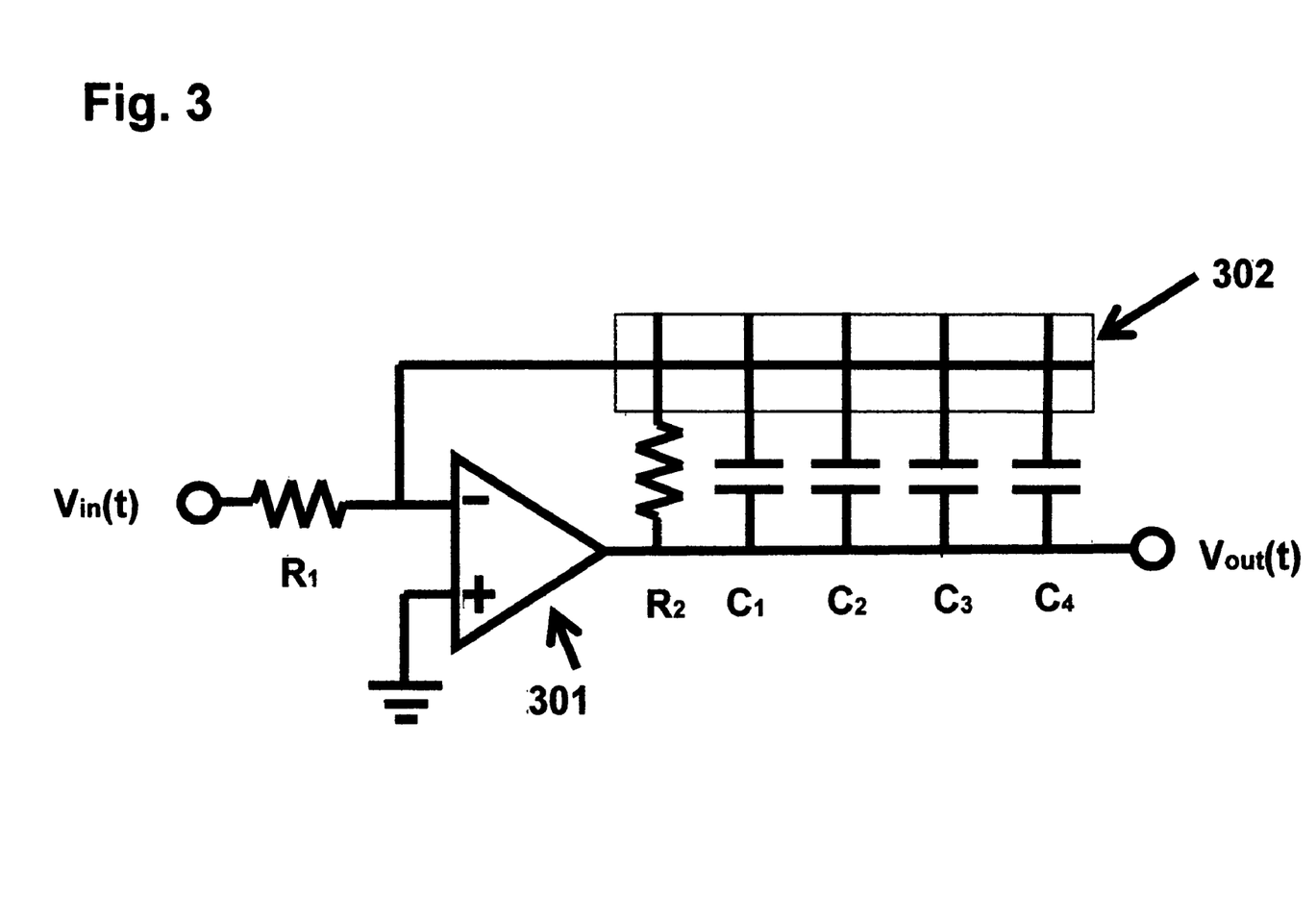
FIG. 3 illustrates an operational amplifier circuit combined with a resistance switch crossbar array and an array of capacitors electrically connected between an output and the inverting terminal of the operational amplifier in accordance with the present invention.

As illustrated in FIG. 3, an operational amplifier 301 includes an inverting input, a non-inverting input and an output connection. An input resistor $R_1$ is connected between an input electrode and the inverting terminal of the operational amplifier 301. A resistor $R_2$ and an array of capacitors $C_1$-$C_4$ are electrically connected between the output of the operational amplifier 301 and a resistance switch crossbar array 302. The resistance switch crossbar array 302 may be formed from intersecting conductive wires which sandwich a resistance switching material such as chalcogenides, conducting polymers, perovskites, rotaxane or catenane molecules, or bilayer oxides as known to the art. The crossbar array may also be formed based on micromechanical or nanomechanical switches formed of carbon nanotubes as used in nanotube RAM designs developed by the company Nantero. As illustrated in FIG. 3 the crossbar array 302 has one row and five columns and each intersection of the crossbar array may be configured to store data in the form of a low or high resistance states via the selective application of programming voltages to the crossbar array. In this manner interconnections may be set which determine the overall behavior of the circuit. For example, setting the crossbar intersection associated with the resistor $R_2$ to a low resistance state and maintaining the other intersections at a high resistance state configures the circuit as an amplifier with a transfer function $V_{out}(t)/V_{in}(t)$ which may roughly be approximated by $-R_2/R_1$ (this of course assumes that the low resistance state of the crossbar intersection is very small relative to $R_1$). However, setting the crossbar intersection associated with the first of the capacitors $C_1$ to a low resistance state can reconfigure the circuit to serve as a low pass filter or integrator. The crossbar interconnections can be appropriately set to connect different ones of the capacitors $C_1$-$C_4$ and provide for different cutoff frequencies of low pass filters. Since parallel capacitors add linearly the setting of multiple capacitors may also usefully be performed. In this case, capacitor values may be set in multiples of two such that $C_3=2C_4$, $C_2=4C_4$, and $C_1=8C_4$ in order to extend the range of possible circuit states capable of being configured by the crossbar array 302.

In the embodiment of FIG. 3 only one resistor and four capacitors are provided as impedance elements, however it is noted that a larger number of resistors and capacitors may be used together with a crossbar array having a larger number of columns to enhance the number of possible states capable of being configured. In addition, other impedance circuit elements or combinations of impedance elements such as inductors or parallel resistor/capacitor (RC) pairs may be provided corresponding to each crosspoint connection of the resistance crossbar switch array 302.

Figure 4:
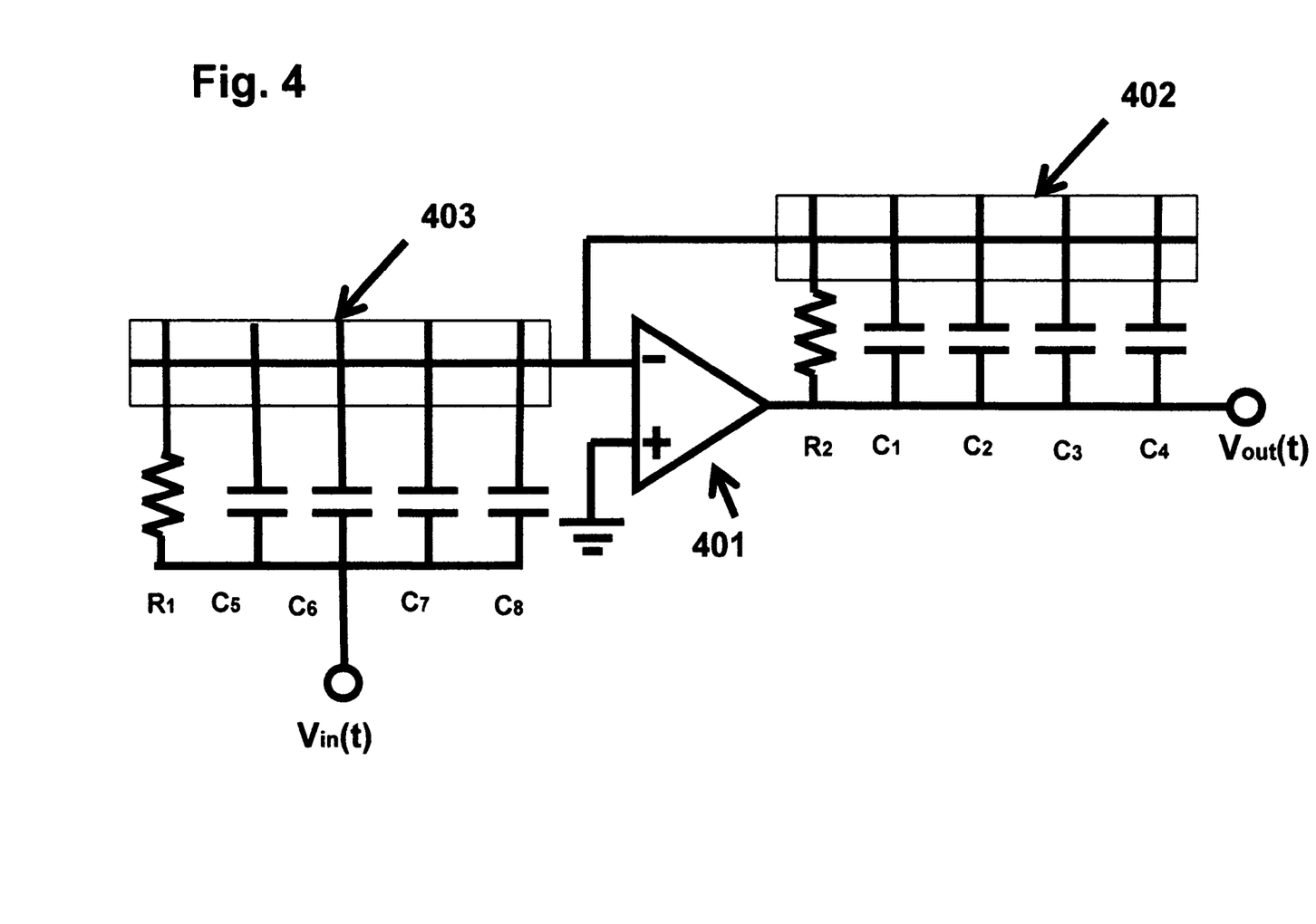
FIG. 4 illustrates a further embodiment including an additional resistance switch crossbar array and an additional array of capacitors connected between an input electrode and the inverting terminal of the operational amplifier.

FIG. 4 illustrates a further embodiment in which both a first resistance switch crossbar array 402 and a second resistance switch crossbar array 403 are connected to an operational amplifier 401. A first array of impedance elements (resistor $R_2$ and capacitors $C_1$-$C_4$) are electrically connected between an output electrode of the operational amplifier 401, which provides output signal $V_{out}(t)$, and the columns of resistance switch crossbar array 402 with the row of the crossbar array connected to the inverting terminal of operational amplifier 401. A second array of impedance elements ($R_1$ and capacitors $C_5$-$C_8$) are electrically connected between second resistance switch crossbar array 403 and an input electrode for input signal $V_{in}(t)$. The row of resistance switch crossbar array 403 is electrically connected to the inverting input of operational amplifier 401. This embodiment allows for an increase in the number of possible configurations that can be set for the circuit and, depending on the resistance states of the crossbar may be configured as a low-pass, high-pass, and bandpass configurations.

Figure 5:
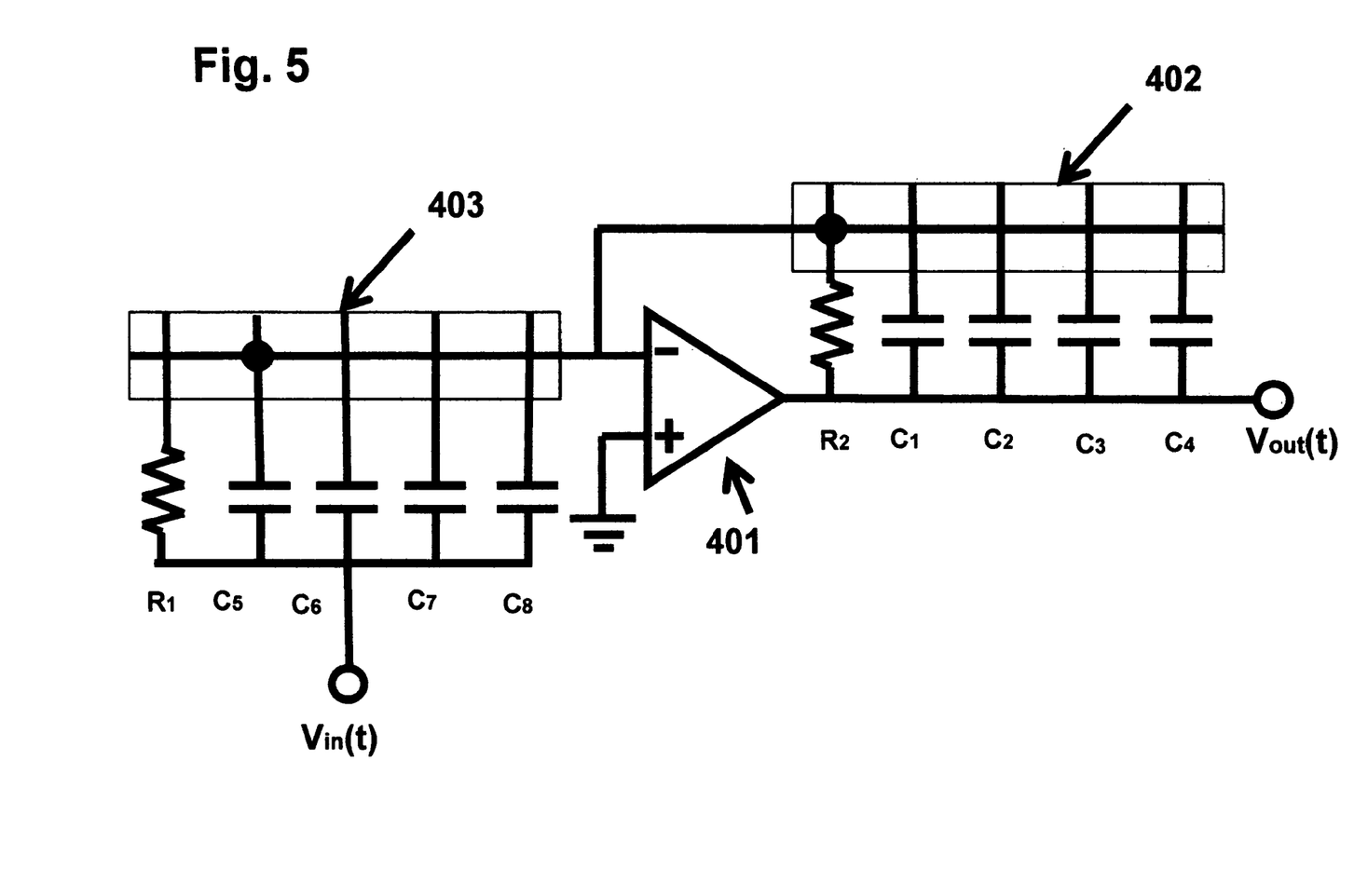
FIG. 5 illustrates the embodiment of FIG. 4 configured as a high pass filter or differentiator circuit.

FIG. 5 illustrates one possible configuration in which the crosspoint of crossbar 403 associated with capacitor $C_5$ is set to a low resistance state and the crosspoint of crossbar 402 associated with $R_2$ is set to a low resistance state with the remainder of the crosspoints set to a high resistance state. This sets the circuit to behave as a high pass filter or differentiator circuit.

Figure 6:
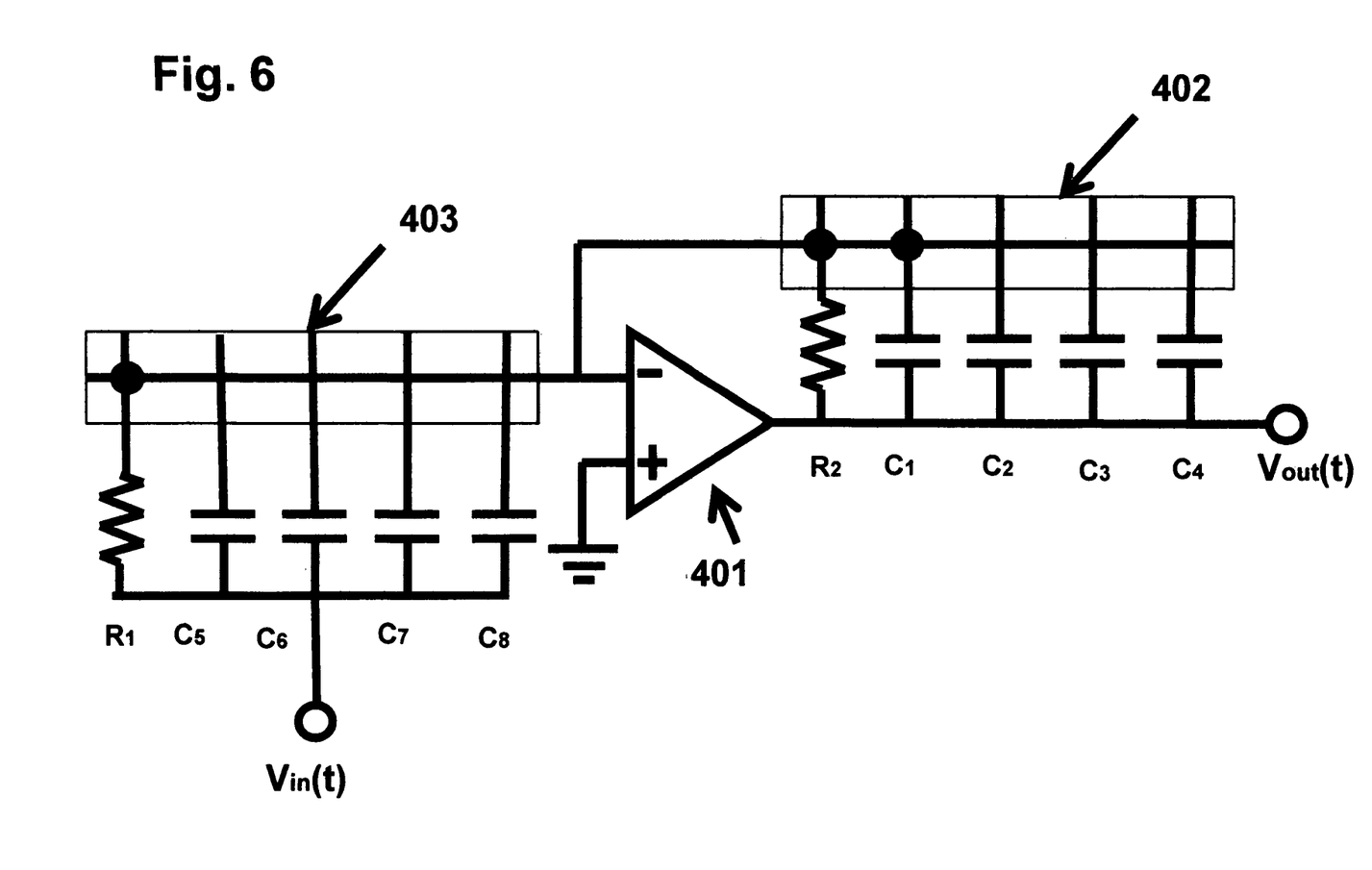
FIG. 6 illustrates the embodiment of FIG. 4 configured as a low pass filter or integrator circuit.

FIG. 6 illustrates a reconfiguration of the circuit in which the crosspoint of crossbar 403 associated with $R_1$ is set to a low resistance state and the crosspoints of crossbar 402 associated with $R_2$ and $C_1$ is set to a low resistance state with the remainder of the crosspoints set to a high resistance state. This sets the circuit to behave as a low pass filter or integrator circuit (with the inclusion of $R_2$ to add stability). Associating the binary states of the resistance values in the crossbars 402 and 403 with binary digits the particular state of the circuit in FIG. 5 can be identified as 01000 10000 and the state of the circuit in FIG. 6 can be identified as 10000 11000 where 1 indicates a low resistance state of the crossbar array and 0 indicates a high resistance state of the crossbar array. The maximum number of circuit configurations associated with each of these binary states would thus be $2^{10}=1028$. The resistor values $R_1$, $R_2$ and capacitor values $C_1$-$C_8$ may be set to predefined values determined by any particular circuit designs or set to relative values such that $R_1=R_2$, $C_3=2C_4$, $C_2=4C_4$, $C_1=8C_4$ and $C_7=2C_8$, $C_6=4C_8$, $C_5=8C_4$ in order to maximize the range of variation in the circuit configurations.

In the embodiments of FIG. 4 only one resistor and four capacitors are provided as impedance elements associated with each of the crossbar arrays 402 and 403, however it is noted that a larger number of resistors and capacitors may be used together with a crossbar array having a larger number of columns to enhance the number of possible states capable of being configured. By setting the relative capacitances by a factor of 2 (i.e. the $i^{th}$ capacitor $C_i$ in an array of capacitors may be set such that $C_i=2^i C$ where C is the smallest capacitor in the array) the number of unique states for the circuit can be defined as $2^{(N+M)}$ where N is the number of columns in the first crossbar array and M is the number of rows in the second crossbar array. Using software techniques such as genetic algorithms or hill climbing the binary states of the resistances in the crossbar arrays may be periodically tested and adjusted to optimize the behavior of a circuit or a device which includes the control circuit in accordance with the present invention. This may be particularly useful in some autonomous robotic applications. In addition, other impedance circuit elements or combinations of impedance elements such as inductors or parallel resistor/capacitor (RC) pairs may be provided corresponding to each crosspoint connection of the resistance crossbar switch arrays.

Figure 7:
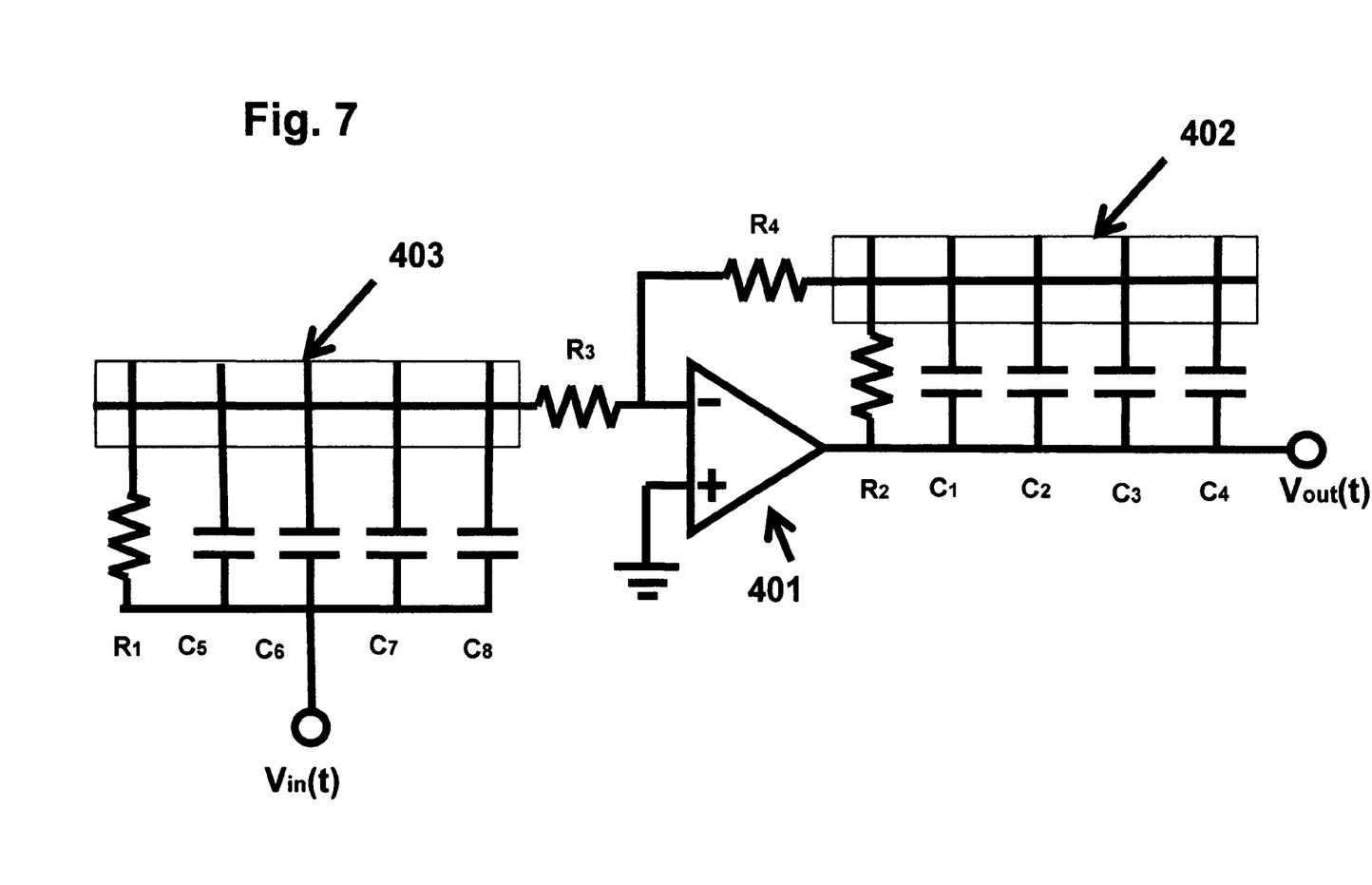
FIG. 7 illustrates a modified embodiment of FIG. 4 including compensating resistors.

FIG. 7 illustrates an alternative embodiment of FIG. 4 in which resistors $R_3$ and $R_4$ are provided to enhance stability and compensate for low resistance states of the resistance switch crossbar arrays 402, 403.

As previously noted a variety of different materials may be used for the resistance switch crossbar arrays. Most recently researchers at Hewlett-Packard have popularized a bilayer oxide material which they are referring to as a memristor (memory resistor). However, a variety of materials such as chalcogenides, perovskites, etc. may also be used for resistance switching. TABLE 1 provides some related patent references discussing a variety of materials useful for resistance switching. In addition, mechanical switching devices such as carbon nanotube crossbars developed by the company Nantero may be used as the resistance switching crossbars.

TABLE 1

| Resistance switching material | Examples of related patent references |
|---|---|
| Bi-layer oxides | U.S. patent application Ser. No. 2007/0200158, U.S. patent application Ser. No. 2008/0090337 |
| Catenanes | U.S. Pat. No. 6,198,655 |
| Chalcogenides | U.S. Pat. No. 4,597,162 |
| Ionic Complexes | U.S. Pat. No. 7,183,141 |
| Perovskites | U.S. Pat. No. 6,531,371 |
| Rotaxanes | U.S. Pat. No. 6,128,214 |
| TCNQ-doped polymer | U.S. Pat. No. 5,272,359 |

Figure 8:
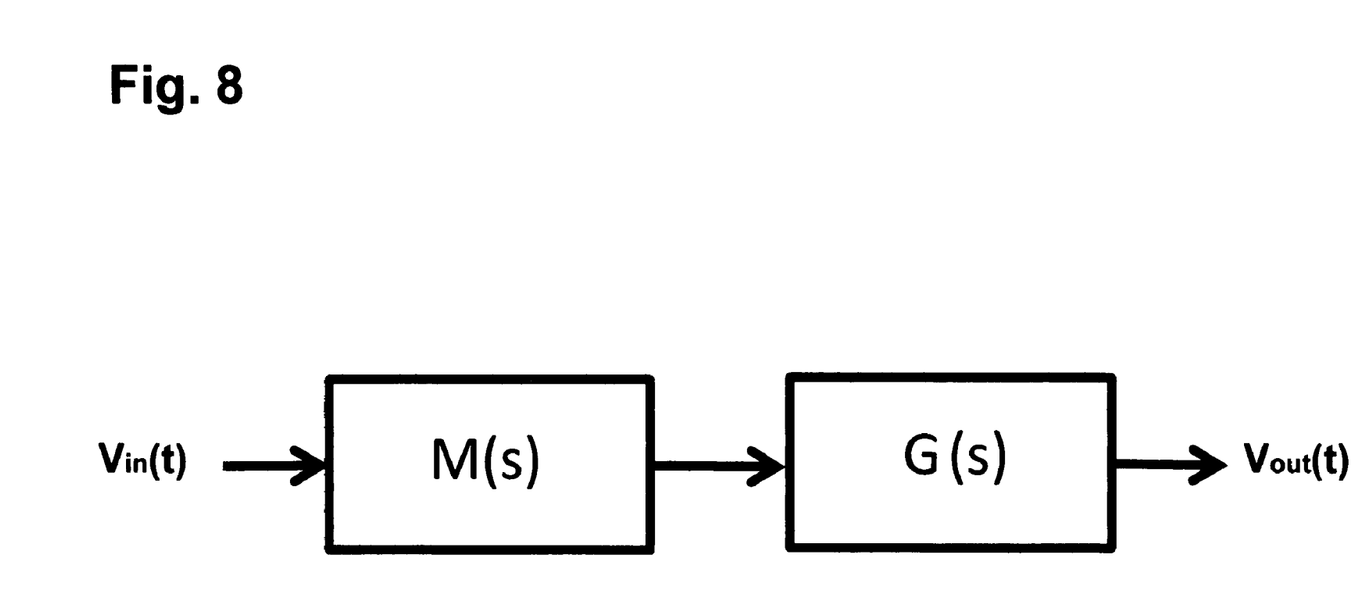
FIG. 8 illustrates the serial connection between a resistance switch crossbar control circuit having a Laplace transform M(s) and a conventional control circuit having a Laplace transform G(s).
Figure 9:
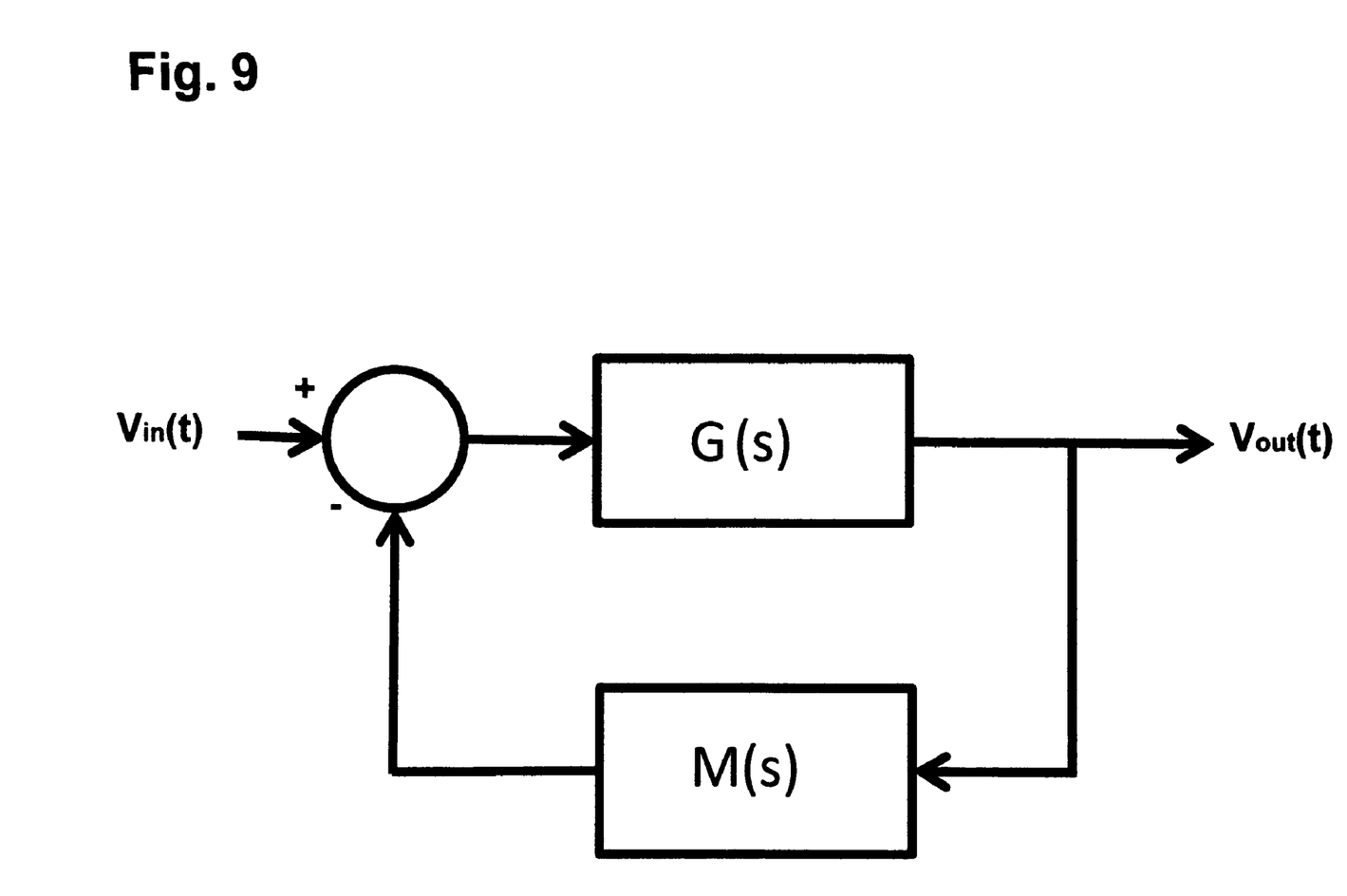
FIG. 9 illustrates a feedback connection between a resistance switch crossbar control circuit having a Laplace transform M(s) and a conventional control circuit having a Laplace transform G(s).

The crossbar control circuits may be combined with more conventional control circuits in series and parallel configurations to achieve a greater range of transfer functions. FIG. 8 illustrates a series arrangement of a conventional control circuit having a transfer function G(s) with a crossbar control circuit having a transfer function M(s). As well known from control theory the overall transfer function in this case is the product G(s)M(s). Adjustment of the crossbar values forming M(s) may be used to add or compensate for poles or zeros of the transfer function G(s). FIG. 8 illustrates a feedback configuration with conventional circuit having a transfer function G(s) and a negative feedback crossbar control circuit having a transfer function M(s). In this case the overall transfer function is expressed as G(s)/[1+G(s)M(s)] as well known to the art. The crossbar control circuit may also be implemented in a variety of other configurations such as feedforward controllers and as part of PID controllers.

In control system applications various methods of programming and reprogramming control circuits and systems using resistance switching crossbars may be usefully employed. Periodic or repeated reprogramming of resistance states of crosspoints of the crossbar array in the control circuit may be performed followed by testing of a parameter related to a design criteria so as to automatically optimize a control circuit. For example, bandwidth, peak overshoot, rise time, settling time, steady-state error, or a variety of combinations of these parameters may be tested after each change in one of the resistance states. An improvement of the measured parameter or combination of parameters with respect to a predetermined desired state would be indicative of maintaining the changed resistance state. However, if the measured parameter generates a greater deviation from the predetermined desired state than the resistance state change may be reversed. In this fashion an "evolution" of the circuit design to match desired conditions can occur over numerous iterations. This can be particularly useful in artificial intelligence and robotics applications.

Alteration of the resistance states of a crossbar control circuits as described above may also be initiated by a change in an environmental condition, such as by detecting an image, temperature variation, motion, sound, a change in weight, or detection of one or more chemicals. This is useful to optimize control circuits to particular environmental conditions. For example, under different temperature ranges resistance values may slightly alter the characteristics of a control circuit. The crosspoint resistances may be adjusted to compensate for or correct such temperature induced changes. In other cases a detection of motion, sound, or certain chemical compositions may require a certain signal processing task to be achieved in applications involving robotics, security systems, or safety systems. Crosspoint resistances to be programmed into crossbar control circuits according to different sensed ranges of temperature, sound, motion, or chemicals may be stored in a look-up table of a memory device. Of course, in addition to automatic reprogramming of the resistance states of crosspoints, manual reprogramming of the crossbar states via a user interface may be performed.

As described above many modifications of the present invention are possible and many applications are possible. The present invention is only limited by the following claims.

I claim:

1. A control circuit including:
   an operational amplifier having an inverting input, a non-inverting input, and an output;
   an array of impedance elements connected to the output of the operational amplifier, wherein the array of impedance elements includes capacitors; and
   a resistance switch crossbar array configured to store data in the form of high or low resistance states, wherein the resistance switch crossbar array is electrically connected between the array of impedance elements and the inverting input of the operational amplifier.

2. The control circuit of claim 1, wherein the resistance switch crossbar array includes a chalcogenide material.

3. The control circuit of claim 1, wherein the resistance switch crossbar array includes a conductive polymer material.

4. The control circuit of claim 1, wherein the resistance switch crossbar array includes a perovskite material.

5. The control circuit of claim 1, wherein the resistance switch crossbar array includes a bilayer oxide material.

6. The control circuit of claim 1, wherein the resistance switch crossbar array is a carbon nanotube crossbar array.

7. A control system including first and second control circuits, at least one of the control circuits including:
   an operational amplifier having an inverting input, a non-inverting input, and an output;
   an array of impedance elements connected to the output of the operational amplifier; and
   a resistance switch crossbar array configured to store data in the form of high or low resistance states, wherein the resistance switch crossbar array is electrically connected between the array of impedance elements and the inverting input of the operational amplifier,
   wherein the control circuits are connected in series.

8. A control system including first and second control circuits, at least one of the control circuits including:
   an operational amplifier having an inverting input, a non-inverting input, and an output;
   an array of impedance elements connected to the output of the operational amplifier; and
   a resistance switch crossbar array configured to store data in the form of high or low resistance states, wherein the resistance switch crossbar array is electrically connected between the array of impedance elements and the inverting input of the operational amplifier,
   wherein the control circuits are connected in a feedback configuration.

9. A method including providing the control circuit of claim 1 and periodically reprogramming resistance states of crosspoints of the crossbar array of the control circuit.

10. A control circuit including:
    an operational amplifier having an inverting input, a non-inverting input, and an output;
    a first array of impedance elements connected to the output of the operational amplifier;
    a first resistance switch crossbar array configured to store data in the form of high or low resistance states, wherein the resistance switch crossbar array is electrically connected between the first array of impedance elements and the inverting input of the operational amplifier;
    a second array of impedance elements connected to an input electrode; and
    a second resistance switch crossbar array configured to store data in the form of high or low resistance states, wherein the second resistance switch crossbar array is electrically connected between the second array of impedance elements and the inverting input of the operational amplifier.

11. The control circuit of claim 10, wherein the arrays of impedance elements includes capacitors.

12. The control circuit of claim 10, wherein the resistance switch crossbar array includes a chalcogenide material.

13. The control circuit of claim 10, wherein the resistance switch crossbar array includes a conductive polymer material.

14. The control circuit of claim 10, wherein the resistance switch crossbar array includes a perovskite material.

15. The control circuit of claim 10, wherein the resistance switch crossbar array includes a bilayer oxide material.

16. The control circuit of claim 10, wherein the resistance switch crossbar array is a carbon nanotube crossbar array.

17. A control system including first and second control circuits, at least one of the control circuits as described in claim 10, wherein the control circuits are connected in series.

18. A control system including first and second control circuits, at least one of the control circuits as described in claim 10, wherein the control circuits are connected in a feedback configuration.

19. A method including providing the control circuit of claim 10 and periodically reprogramming resistance states of crosspoints of the crossbar arrays of the control circuit.

* * * * *